March 22, 1960 C. W. MUELLER 2,929,885

SEMICONDUCTOR TRANSDUCERS

Filed May 20, 1953

INVENTOR.

Charles W. Mueller

BY J. L. Whittaker

ATTORNEY

United States Patent Office 2,929,885
Patented Mar. 22, 1960

2,929,885

SEMICONDUCTOR TRANSDUCERS

Charles W. Mueller, Princeton, N.J., assignor to Radio Corporation of America, a corporation of Delaware Application May 20, 1953, Serial No. 356,128
16 Claims. (Cl. 179—121)

This invention relates to semiconductor signal translating devices and a method of operation thereof and particularly to P–N junction devices suitable for use in converting mechanical forces into electrical signals.

Presently known semiconductor transducers are usually point-contact devices which comprise, generally, a crystal of semiconductor material having a sharply pointed wire in rectifying contact therewith. Such a device operates by the variation in the pressure of the point contact on the crystal or by the variation in the position of the point on the crystal. Point-contact transducers, like point-contact transistors, possess certain disadvantages. For example, in such point-contact devices, the contact wire is extremely thin, of the order of one or two mils in diameter and its contact with the crystal is quite critical. Accordingly, such devices tend to be mechanically and electrically unstable so that extreme care must be exercised in their assembly, and relatively complex support and mounting means are required. In addition, since the contact area between the point electrode and the crystal is small, the power handling capacity of the device is limited. Furthermore, point-contacts tend to produce considerable noise signal components in an output signal from the device.

Accordingly, an important object of this invention is to provide a semiconductor signal translating device of new and improved form.

Another object is to provide an improved transducer of the P–N junction type and method of operation thereof.

Still another object of the invention is to provide an improved transducer which may be operated in both the forward and reverse directions.

Another object of the invention is to provide a transducer having improved stability and power handling capacity.

In general the purposes and objects of this invention are accomplished by preparing a semiconductor crystal having a region of P-type conductivity material and a region of N-type conductivity material separated by a rectifying barrier. A base electrode is connected to one of the regions and an actuating vibratile member is bonded to the other region. The vibratile member is adapted to apply compressive and tensile forces to the P–N junction whereby the current output of the device is varied. The actuating member may be connected to the movable diaphragm of a microphone or other vibration or mechanical motion source.

The invention is described in greater detail by reference to the accompanying drawing wherein.

Similar elements are designated by similar reference characters throughout the drawing.

Figure 1:
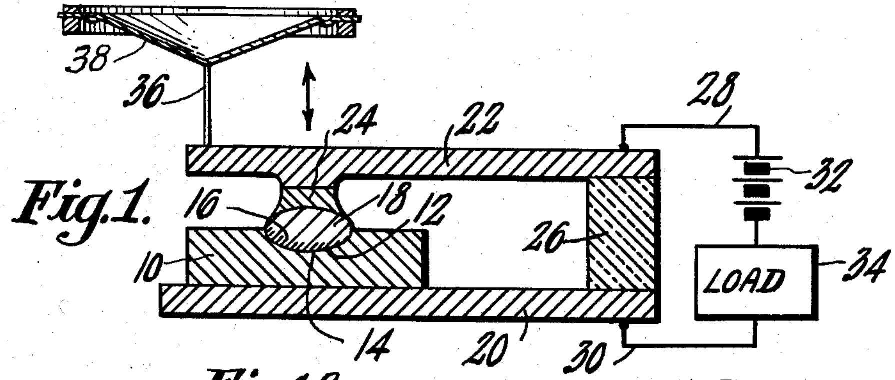
Fig. 1 is a sectional elevational view of a device constructed in accordance with one embodiment of the invention.

Referring to Figure 1, a semiconductor signal translating device according to the invention comprises a body or wafer 10 of semiconductor material which may be germanium or silicon or the like of N-type or P-type conductivity. A P–N junction 12 is formed beneath one surface of the wafer or crystal. The junction may be prepared according to a method described in a U.S. patent application of the present inventor, Serial No. 294,741, filed June 20, 1952, and assigned to the assignee of this application.

According to one suitable procedure for preparing the P–N junction and following generally the teaching in the aforementioned application, the crystal or body 10 is provided with any suitable surface treatment. Next, a drop of a wetting agent or a flux, for example zinc chloride, is placed on one surface of the crystal and a disk or pellet of a so-called impurity material is positioned in the drop of flux and heated to alloy at least a portion of the impurity material into the body of semiconductor to form the desired P–N junction. According to this method, the P–N junction which is formed comprises a rectifying barrier 14 and a thin layer 16 adjacent thereto of material of a type of conductivity opposite to that of the body 10. The portion 18 of material adjacent to the layer 16 is essentially an alloy of the impurity substance and the material of the semiconductor body and does not have semiconductor properties. Surface treatment of the crystal and the alloyed region may be carried out as required to prevent shorting out of the junction at the surface of the semiconductor wafer by lateral flowing of impurity material.

With respect to the impurity material employed in forming the P–N junction 12, if the semiconductor body 10 is of N-type material, for example germanium, then the impurity disk may be any one of indium, gallium, aluminum, boron, or zinc. If the body is of P-type material then the impurity substance may be any one of arsenic, bismuth, antimony or phosphorus. The impurity disks may also be alloys including one or more of the materials in each group. The principles of the invention will be described or directed hereinafter, by example, to a body of N-type germanium having a P-type region formed therein by the alloying of an indium disk or pellet.

A base electrode 20 which may comprise a plate of a suitable metal, for example copper or nickel, is soldered in ohmic contact with a portion of the surface of the semiconductor crystal 10. According to the invention, an actuating element 22 which may be a metal plate or disk, or the like, of copper or nickel or the like is bonded to the portion 18 of alloy material adjacent to the P–N junction 12. The bond is made preferably through a quantity of a low melting point solder 24, for example Cerrobend or Wood's metal or the like. Cerrobend is the trade name of an alloy of 50% bismuth, 26.7% lead, 13.3% tin, and 10% cadmium. A quantity of the low melting point solder (melting point of the order of 70° C.) is positioned between the actuating element 22 and the portion of the junction 18 and is heated, for example by a stream of warm hydrogen to a temperature slightly above its melting point, a temperature of the order of 80° C. At this temperature the solder material 24 melts and forms a bond with the portion 18 of the alloyed P–N junction. Prior to the soldering operation, a block of insulating material 26, for example rubber, is positioned between the base electrode 20 and the actuating plate 22 to provide support and the desired spacing therebetween.

During the operation of soldering the actuating element 22 to the portion 18, care must be exercised to avoid the application of excessive pressure thereto and thereby to prevent crushing of the alloy material 18. If the portion 18 were crushed, the material thereof might spread across the barrier 14 to the body 10 and thereby cause an electrical short-circuit of the P–N junction 12. Care must also be exercised to prevent the flow of the solder material across the junction to the germanium due to excessive heating during the soldering step. After the soldering operation has been completed and the device has been assembled, an electrical lead 28 is connected to the actuating plate 22 and another lead 30 is connected to the base electrode 20. A source of bias voltage 32 is connected between the two leads 28 and 30 through a suitable load device 34. The actuating element 22 may be connected through a rod 36 or other means to, for example, the diaphragm 38 of a microphone or other vibratory source, whereby the device may be adapted to operate as a transducer. The device of the invention may also be connected to any other means for imparting mechanical vibrations or varying pressure thereto.

In operation of the device shown in Figure 1 after a suitable bias has been applied across the P–N junction 12 by the battery 32, a varying pressure is applied to the junction through the actuating element 22 and the region 16. The changes in pressure applied to the junction vary the operating characteristics of the device and modulate the current flow therethrough to the load 34.

Figure 2:
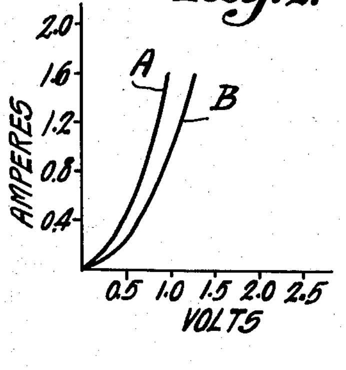
Fig. 2 is a graph showing certain operating characteristics of the device shown in Fig. 1.

One characteristic of the device of the invention is that it may be operated in the forward direction or in the reverse direction. If the device shown, having an N-type body 10 and P-type region 16, is operated in the forward direction, the positive terminal of the battery 32 is connected to the actuating element 22 and the negative terminal is connected through the load 34 to the base electrode 20. Such a voltage may be of the order of one-half to three-quarters of a volt. Figure 2 shows two curves representing the volt-ampere characteristics of the device under different operating conditions. For example, curve A represents the characteristics of the device when a specific amount of pressure is applied to compress the P–N junction 12. Curve B represents the characteristic when the actuating element 22 is moved in the opposite direction to apply a specific amount of tension to the junction. It can be seen from the curves that as the compressive force on the junction is increased the current output of the device increases. The device, when operated in the forward direction, is a low voltage high current device having low input impedance.

Figure 3:
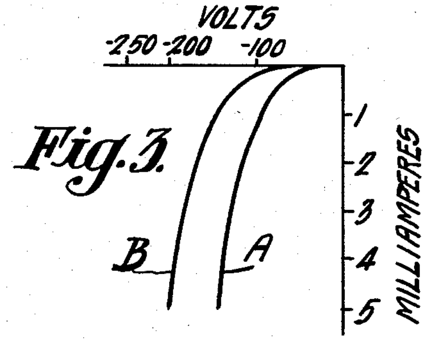
Fig. 3 is a graph showing another set of operating characteristics of the device shown in Fig. 1; and, Fig. 4 is a sectional elevational view of a device constructed in accordance with a second embodiment of the invention and a schematic circuit in which the device may be operated.

The device of Figure 1 may also be operated in the reverse direction by reversing the connections between the battery 32 and the actuating element 22 and base electrode 20. The magnitude of the applied voltage must also be increased to a value in the range of 50 to 100 volts. This is the Zener or field emission region of the device. Volt-ampere characteristic curves for operation in the reverse direction are shown in Figure 3. Two curves are also shown, curve A for the characteristic when a specific amount of compressive force is applied and curve B when a specific amount of tensile force is applied. Operation in the reverse direction shows a rapid increase in current flow in the Zener or field emission region. Thus it may be seen that a change in pressure results in a change in the field emission current flow. Thus, the device, when operated in the reverse direction, is a high voltage, low current device having a high input impedance.

The exact theory of operation of the device has not been established but the present theory is based on the hypothesis that the barrier 14 and the P-type region 16 have a complex crystalline structure comprising irregular peaks and valleys. When pressure is applied to the portion 18, the P-type region 16 and the barrier 14 are compressed and more intimate contact between the two is achieved. The junction region may be considered as a plurality of individual operative units and, when pressure is applied to the junction, more of the units are effectively connected into operative relation than were so related before the pressure was applied. When pressure is applied in the opposite direction and a tensile force results, the elements of the junction are spread apart and fewer units of the junction are effectively connected in operative relation.

Figure 4:
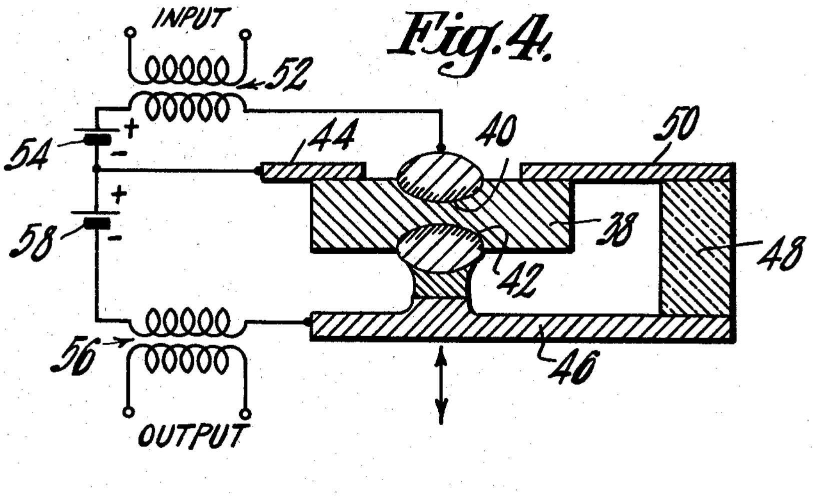

The principles of the invention may also be applied to P–N junction transistor. The transistor, referring to Figure 4, comprises a body 38 of semiconductor material, for example N-type germanium, having two P–N junctions 40, 42 formed therein, preferably by an alloying operation such as the foregoing. A base electrode 44 is connected to the body or crystal 38 and an actuating member 46 is connected in operative relation with either one of the junctions, e.g. 42, and is supported in position by means of an insulating block 48 placed between it and a metal plate 50 bonded to the crystal. In this embodiment, also, the element 46 is connected to the diaphragm of a microphone or the like.

In conventional fashion, one of the P–N junctions, e.g. 40, is operated as an emitter electrode by connection through a signal source 52 to the positive terminal of a battery 54, the negative terminal of which is connected to the base electrode 44. By this means, the emitter electrode is biased in the forward direction with respect to the body 38 of the device. The P–N junction 42 is operated as the collector electrode by a connection through a load device 56 the negative terminal of a battery 58, the positive terminal of which is connected to the base electrode 44. Thus, the collector electrode is biased in the reverse direction. As described above, pressure variations applied to the collector P–N junction 42 through the actuating element 46 vary the output impedance of the junction and, accordingly, the current output from the device is modulated.

What is claimed is:

1. A semiconductor device comprising a body of semiconductor material, alternating regions of different type conductivity material in said body, said regions being separated by rectifying barriers, and means connected to one of said regions for applying pressure to one of said barriers.

2. A semiconductor device comprising a body of semiconductor material, at least one P–N rectifying junction present in said body, regions of P-type and N-type conductivity material separated by said junction, and means for applying a varying pressure to said junction through one of said regions adjacent thereto.

3. A semiconductor device comprising a body of semiconductor material, at least one alloyed P–N rectifying junction present in said body, regions of P-type and N-type conductivity material separated by said junction, and means for applying a varying pressure to said junction through one of said regions adjacent thereto.

4. A semiconductor device comprising a body of semiconductor material, a P–N rectifying junction present in said body, regions of P-type and N-type conductivity material separated by said junction, and an actuating member bonded to one of said regions for applying pressure therethrough to said P–N junction.

5. A semiconductor device comprising a body of semiconductor material, a pair of P–N junctions present in said body, one of said junctions comprising an emitter electrode and the other of said junctions comprising a collector electrode, and means for applying a varying pressure to one of said junctions.

6. A semiconductor device comprising a body of semiconductor material, a P–N junction present in said body, said P–N junction including regions of P-type and N-type conductivity material separated by a rectifying barrier, and an actuating member bonded to one of said regions for applying compressive and tensile forces to said P–N junction.

7. A device according to claim 6 and wherein said P–N junction is biased in the forward direction.

8. A device according to claim 6 and wherein said P–N junction is biased in the reverse direction.

9. The method of operating a semiconductor device having at least one P–N junction therein comprising successively applying compressive and tensile forces to said junction whereby the current flow through said device is varied.

10. A semiconductor device comprising a body of semiconductor material including two regions of different conductivity-type material separated by a rectifying barrier, and means connected to one of said regions for applying a force on said barrier.

11. A semiconductor device comprising a body of semiconductor material, at least one P–N junction present in said body, regions of P-type and N-type conductivity material separated by said junction, and means connecting a microphone diaphragm to said junction through one of said regions adjacent thereto.

12. A semiconductor device comprising a body of semiconductor material, alternating regions of different type conductivity material in said body, said regions being separated by rectifying barriers, and means for obtaining an electrical signal in response to a mechanical signal including mechanical means connected to one of said regions.

13. A semiconductor device comprising a body of semiconductor material, at least one P–N rectifying junction present in said body, regions of P-type and N-type conductivity material separated by said junction, and means for obtaining an electrical signal in response to a mechanical signal including mechanical means connected to one of said regions.

14. A semiconductor device comprising a body of semiconductor material, at least one alloy P–N rectifying junction present in said body, regions of P-type and N-type conductivity material separated by said junctions, and means for obtaining an electrical signal in response to a mechanical signal including mechanical means connected to said junction through one of said regions adjacent thereto.

15. A semiconductor device comprising a body of semiconductor material, a P–N rectifying junction present in said body, regions of P-type and N-type conductivity material separated by said junction, an actuating member bonded to one of said regions, and means for obtaining an electrical signal in response to a mechanical signal including mechanical means connected to said actuating member for appling pressure therethrough to said P–N junction.

16. A semiconductor device comprising a body of semiconductor material, a P–N junction present in said body, said P–N junction including regions of P-type and N-type conductivity material separated by a rectifying barrier, an actuating member bonded to one of said regions, and means for obtaining an electrical signal in response to a mechanical signal including mechanical means connected to said actuating member for applying compressive and tensile forces to said P–N junction.

References Cited in the file of this patent

UNITED STATES PATENTS

| | | |
|---|---|---|
| 2,497,770 | Hanson | Feb. 14, 1950 |
| 2,522,521 | Kock | Sept. 19, 1950 |
| 2,549,550 | Wallace | Apr. 17, 1951 |
| 2,602,211 | Scaff et al. | July 8, 1952 |
| 2,632,062 | Montgomery | Mar. 17, 1953 |
| 2,732,519 | Freedman | Jan. 24, 1956 |
| 2,776,920 | Dunlap | Jan. 8, 1957 |